US007755426B2

(12) United States Patent
Kocaman et al.

(10) Patent No.: US 7,755,426 B2
(45) Date of Patent: Jul. 13, 2010

(54) VARIABLE GAIN AMPLIFIER AND METHOD FOR ACHIEVING VARIABLE GAIN AMPLIFICATION WITH HIGH BANDWIDTH AND LINEARITY

(75) Inventors: Namik K. Kocaman, San Clemente, CA (US); Jun Cao, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 12/135,720

(22) Filed: Jun. 9, 2008

(65) Prior Publication Data

US 2008/0258814 A1 Oct. 23, 2008

Related U.S. Application Data

(63) Continuation of application No. 11/731,481, filed on Mar. 30, 2007, now Pat. No. 7,560,986.

(60) Provisional application No. 60/840,123, filed on Aug. 25, 2006.

(51) Int. Cl.
*H03F 3/45* (2006.01)
(52) U.S. Cl. .................... 330/254; 330/284
(58) Field of Classification Search ............ 330/254, 330/278, 284
See application file for complete search history.

(56) References Cited

U.S. PATENT DOCUMENTS

| 5,604,460 | A | 2/1997 | Sehrig et al. |
| 5,638,409 | A | 6/1997 | Awata et al. |
| 5,684,431 | A | 11/1997 | Gilbert et al. |
| 5,870,042 | A | 2/1999 | Noda |
| 6,177,899 | B1 | 1/2001 | Hsu |
| 6,204,784 | B1 | 3/2001 | Hatfield |
| 6,466,629 | B1 | 10/2002 | Isaksson et al. |
| 6,522,282 | B1 | 2/2003 | Elbornsson |
| 6,570,410 | B2 | 5/2003 | Manganaro |
| 6,603,415 | B1 | 8/2003 | Somayajula |
| 6,653,966 | B1 | 11/2003 | van der Goes et al. |
| 6,707,868 | B1 | 3/2004 | Camagna et al. |
| 6,982,664 | B1 | 1/2006 | Nairn |

(Continued)

FOREIGN PATENT DOCUMENTS

EP 1006697 A2 7/2000

(Continued)

OTHER PUBLICATIONS

Notice of Allowance for U.S. Appl. No. 11/845,762, mailed Dec. 3, 2008, and received on Dec. 8, 2008.

(Continued)

*Primary Examiner*—Khanh V Nguyen
(74) *Attorney, Agent, or Firm*—Brake Hughes Bellermann LLP

(57) ABSTRACT

Various example embodiments are disclosed. According to one example embodiment, a high bandwidth, fine granularity variable gain amplifier ("VGA") may comprise an attenuator, a gain block and a gain adjustment control. The attenuator may comprise at least one pair of attenuator differential input nodes and at least one pair of attenuator differential output nodes. The gain block may comprise at least one pair of gain block differential input nodes coupled to the at least one pair of attenuator differential output nodes and at least one pair of gain block differential output nodes. The gain adjustment control may be configured to adjust a gain of the gain block.

10 Claims, 10 Drawing Sheets

U.S. PATENT DOCUMENTS

| | | |
|---|---|---|
| 7,010,269 B2 | 3/2006 | Meehan et al. |
| 7,027,503 B2 | 4/2006 | Smee et al. |
| 7,053,804 B1 | 5/2006 | Nairn |
| 7,148,828 B2 | 12/2006 | Fernandex et al. |
| 7,215,274 B2 | 5/2007 | Liu |
| 7,233,270 B2 | 6/2007 | Lin |
| 7,260,377 B2 * | 8/2007 | Burns et al. .................. 330/254 |
| 7,292,101 B2 | 11/2007 | Kocaman et al. |
| 7,324,038 B2 | 1/2008 | van der Goes et al. |
| 7,355,476 B2 | 4/2008 | Kasha et al. |
| 7,471,339 B2 | 12/2008 | Smith et al. |
| 7,525,462 B2 | 4/2009 | Parthasarthy et al. |
| 7,525,470 B2 | 4/2009 | Parthasarthy et al. |
| 7,560,986 B2 | 7/2009 | Kocaman |
| 2002/0164966 A1 | 11/2002 | Meehan et al. |
| 2003/0174783 A1 | 9/2003 | Rahman et al. |
| 2005/0040891 A1 | 2/2005 | Sobel |
| 2005/0130617 A1 | 6/2005 | Burns et al. |
| 2005/0270212 A1 | 12/2005 | Smith et al. |
| 2006/0067699 A1 | 3/2006 | Chandrasekhar et al. |
| 2007/0024484 A1 | 2/2007 | Liu |
| 2007/0133719 A1 | 6/2007 | Agazzi et al. |
| 2008/0048896 A1 | 2/2008 | Parthasarthy et al. |
| 2008/0049825 A1 | 2/2008 | Chen et al. |
| 2008/0049847 A1 | 2/2008 | Telang et al. |
| 2008/0069198 A1 | 3/2008 | Bhoja et al. |
| 2008/0069199 A1 | 3/2008 | Chen et al. |
| 2008/0187082 A1 | 8/2008 | Bhoja et al. |
| 2008/0238542 A1 | 10/2008 | Kocaman |
| 2008/0240325 A1 | 10/2008 | Agazzi et al. |
| 2008/0258814 A1 | 10/2008 | Kocaman et al. |
| 2008/0272952 A1 | 11/2008 | Wood |
| 2009/0310665 A1 | 12/2009 | Agazzi et al. |

FOREIGN PATENT DOCUMENTS

| | | |
|---|---|---|
| KR | 10-2006-0001004 | 1/2006 |
| WO | 0213424 A2 | 2/2002 |
| WO | 2002-071616 A2 | 9/2002 |
| WO | 02071616 A2 | 9/2002 |

OTHER PUBLICATIONS

Notice of Allowance for U.S. Appl. No. 11/845,765, mailed Dec. 18, 2008.

Stojanavic, Vladimier et al., "Adaptive Equalizer and Data Recovery in a Dual-Mode (PAM2/4) Serial Link Transceiver", Rambus, Inc., Los Altos CA 94022, USA; Department of Electrical Engineering, Stanford University, CA 94305, USA, (2004), pp. 1-4.

Koc, UT-VA "Adaptive Electronic Dispersion Compenstor for Chromatic and Polarization-Mode Dispersions in Optical Communications Systems", Bell Labs, Lucent Technologies, USA, Apr. 1, 2004; EURASIP Journal on Applied Signal Processing 2005:10, 1584-1592; 2005 Hindlaw Publishing Corporation, (2005).

Nikolic, Borivoje "Advanced Topics in Circuit Design: High-Speed Electrical Interfaces", EE209C-Spring 2004; Lecture 16: Components, Decision Feedback Equalizers, (Mar. 11, 2004), pp. 1-19.

Mueller, Kurt H., "Timing Recovery in Digital Synchronous Data Receivers", IEEE Transactions on Communications, vol. Com-24, No. 5, (May 1976), pp. 516-531.

Notice of Allowance from U.S. Appl. No. 11/845,765 dated Oct. 10, 2008.

European Search report from U.S. Appl. No. 11/837,301 dated Dec. 6, 2007.

European Search report from U.S. Appl. No. 11/837,278 dated Dec. 6, 2007.

Notice of Allowance from U.S. Appl. No. 11/845,762 mailed Aug. 11, 2008.

Notice of Allowance from U.S. Appl. No. 11/731,481 mailed Feb. 10, 2009.

Office Action from U.S. Appl. No. 11/731,481 mailed Aug. 20, 2008.

Office Action received for U.S. Appl. No. 12/135,720, mailed on Mar. 19, 2009, 8 pages.

Supplemental Notice of Allowability received for U.S. Appl. No. 11/845,762, mailed on Mar. 24, 2009, 5 pages.

Notice of Allowance mailed Apr. 14, 2010 U.S. Appl. No. 11/837,301, 32 pages.

* cited by examiner

VARIABLE GAIN AMPLIFIER AND METHOD FOR ACHIEVING VARIABLE GAIN AMPLIFICATION WITH HIGH BANDWIDTH AND LINEARITY

PRIORITY CLAIM

This application is a continuation-in-part application of U.S. Non-Provisional application No. 11/731,481, filed Mar. 30, 2007, entitled, "Variable Gain Amplifier and Method for Achieving Variable Gain Amplification with High Bandwidth and Linearity," now Issued U.S. Pat. No. 7,560,986, which claimed the benefit of priority based on U.S. Provisional Application No. 60/840,123, filed Aug. 25, 2006, entitled, "Digital Electronic Dispersion Compensation for Multi-Mode Fiber," the disclosures of both of which are hereby incorporated by reference.

TECHNICAL FIELD

This description relates to analog circuits. In particular, this description relates to an amplifier and associated circuit topology for achieving variable gain amplification with high bandwidth and fine granularity promoting high linearity.

BACKGROUND

In many applications it may be necessary to amplify an analog signal exhibiting a wide amplitude range. For example, a wide range of input signals may be present at the receiving end of a multi-mode fiber optic cable. Such a signal may require analog conditioning or digital signal processing to correct for degradation introduced by the physical medium of transmission, i.e., the optical cable itself.

In many signal conditioning systems, especially communication links, in order to compensate for a wide amplitude range of received information bearing signals, the input signals are subjected to amplitude adjustment using a VGA ("Variable Gain Amplifier"). A VGA allows for the selection and adjustment of gain to be applied to an input signal. Amplitude adjustment or so-called gain adjustment of an incoming signal by a VGA is used to achieve an amplitude level well above the noise and offset thresholds. Without the application of gain adjustment, it may not be feasible to perform further post processing of an incoming signal, such as adaptive equalization.

Cascading gain stages may provide a wide range of amplification and/or attenuation. However, each additional stage may be undesirable as it will introduce harmonic distortion. Harmonic distortion typically arises due to non-linearities inherent in each stage.

Thus, it is desirable to devise an amplitude adjustment scheme using a VGA with a low number of gain stages such that the VGA is suitable for high bandwidth and high linearity applications with a wide amplitude adjustment range.

SUMMARY

Various example embodiments are disclosed relating to variable gain amplifiers.

DETAILED DESCRIPTION

Figure 1A:
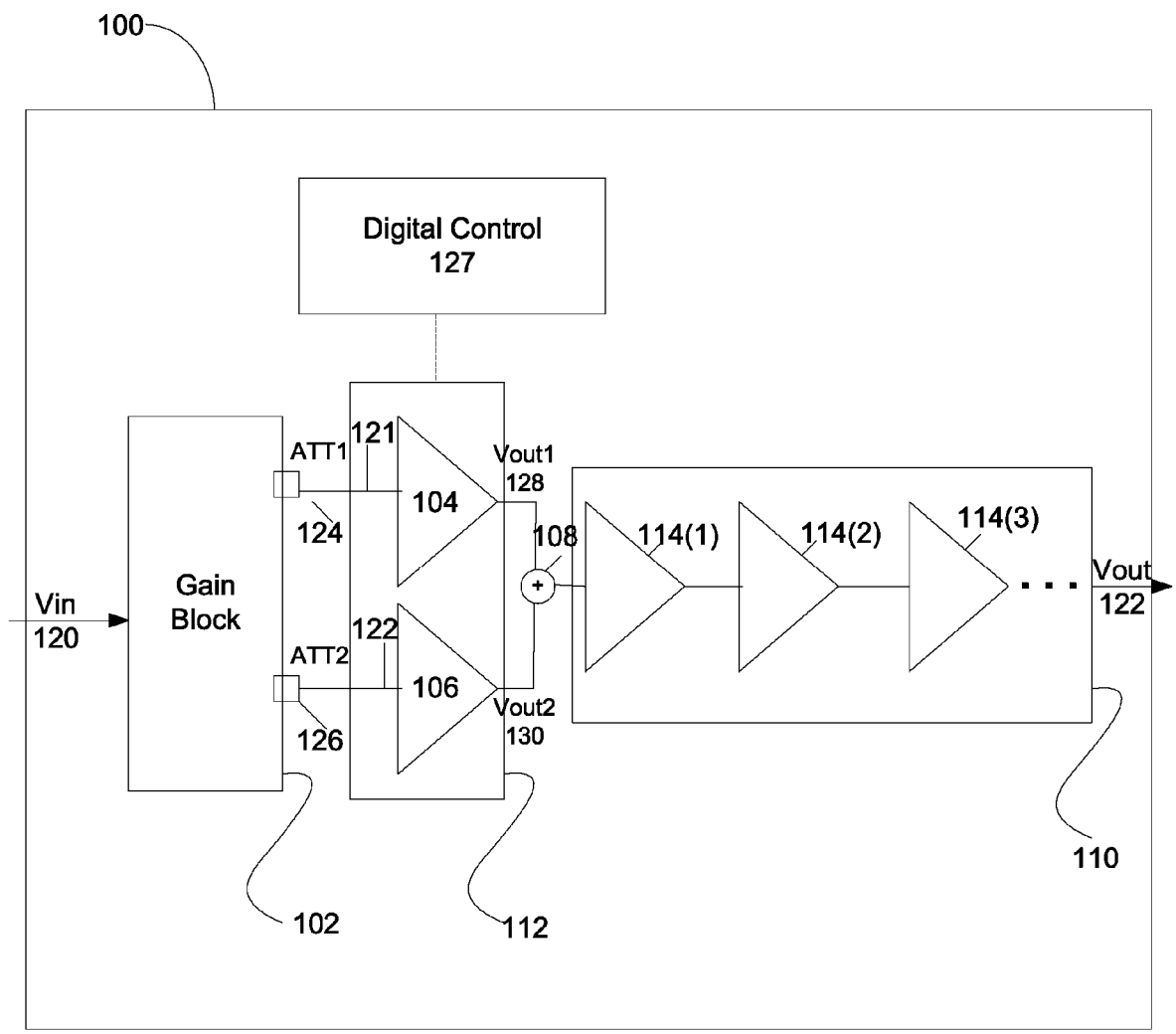
FIG. 1A is a block diagram of a Variable Gain Amplifier (VGA) for achieving a high gain output signal from a received input signal with high bandwidth and linearity according to an example embodiment.

FIG. 1A is a block diagram of a VGA topology 100 for achieving a high gain output signal 122 having substantially high bandwidth and linearity from a received input signal 120 according to an example embodiment. The VGA topology may receive an input signal 120 which is passed to a gain block 102, a parallel gain block 112, and a cascade gain block 110 to produce a VGA output signal 122. Although FIG. 1 depicts single-ended signals, it will be understood by skilled practitioners that the topology shown in FIG. 1A may be utilized with differential signals.

The gain block 102 may compensate for a wide range of input signal 120 amplitudes. The gain block 102 may provide gain greater than unity, in which case it may function as an amplifier. Alternatively, the gain block 102 may provide gain less than unity in which case it may function as an attenuator.

According to one embodiment, the gain block 102 may be an attenuator that comprises passive components to achieve attenuation of the input signal with high bandwidth. For example, the gain block 102 may comprise a resistive ladder, including a plurality of resistors (described below with reference to FIGS. 3A and 3B). The gain block 102 may comprise a plurality of output taps (e.g., 124, 126) that provide output signals at various attenuation amplitudes. For example, output tap 124 may provide a high gain output (ATT1) feeding high gain signal path 121 while output tap 126 may provide a low gain output (ATT2) feeding low gain signal path 122.

The parallel gain block 112 may include a plurality of parallel gain stages 104, 106. Although only two parallel gain stages 104, 106 are shown in FIG. 1, it will be understood by skilled practitioners that the parallel gain block may include an arbitrary number of parallel gain stages (e.g., 104, 106). As described below, the parallel gain stages 104, 106 may each respectively comprise a plurality of gm cells (not shown in FIG. 1 but described below). Gm refers to a transconductance of a simple amplification circuit in which a voltage signal is received at an input to generate a current signal at an output. Both parallel gain stages 104, 106 may be identical comprising identical gm stages with identical current densities and to minimize phase delay between the respective outputs of the gain stages 104, 106.

The parallel gain stages 104, 106 in parallel gain block 112 may respectively be placed in the high gain signal path 121 and the low gain signal path 122. In particular, the high gain signal path 121 may be coupled to the high gain output tap 124 of gain block 102 while the low gain signal path 122 may be coupled to the low gain output tap 126 of the gain block 102. As described below, depending upon the particular combination of gm stages comprising each of the parallel gain stages 104, 106 that may be selectively activated, various amplification levels may be achieved at summing block 108. The number of combinations of gm stages that may be activated may directly provide fine granular control of the amplification level (e.g., each combination may provide a varying level of gain adjustment). A digital control block 127 may be utilized to control the activation of gm stages within parallel gain block 112. One particular example of a process for selecting a gain for a VGA is illustrated below with respect to FIG. 7.

The outputs of the parallel gain block 112 (e.g., parallel gain stages 104, 106) may be summed at a summing block 108 to provide an input to a cascade gain block 110. Although FIG. 1A shows only two summed gain stages (104, 106), it will be understood by skilled practitioners that any arbitrary number of parallel gain stages comprising a parallel gain block 112 may be summed at the summing block 108.

The summed output signals from the parallel gain block 112 may be received by a cascade gain block 110 where the summed signal is amplified by one or more cascaded gain stages (e.g., 114(1), 114(2), 114(3)). The digital control block 127 may control the one or more cascaded gain stages (e.g., 114(1), 114(2), 114(3)). Although the cascade gain block 110 shown in FIG. 1A shows three cascaded gain stages 114(1), 114(2) and 114(3), it will be understood by skilled practitioners that the cascade gain block 110 may include any number of cascaded gain stages. The output signal 122 of the cascade gain block 110 may then be further processed. Inductive peaking may be utilized at the output of every gain stage in order to reduce phase delay problems and increase bandwidth.

Figure 1B:
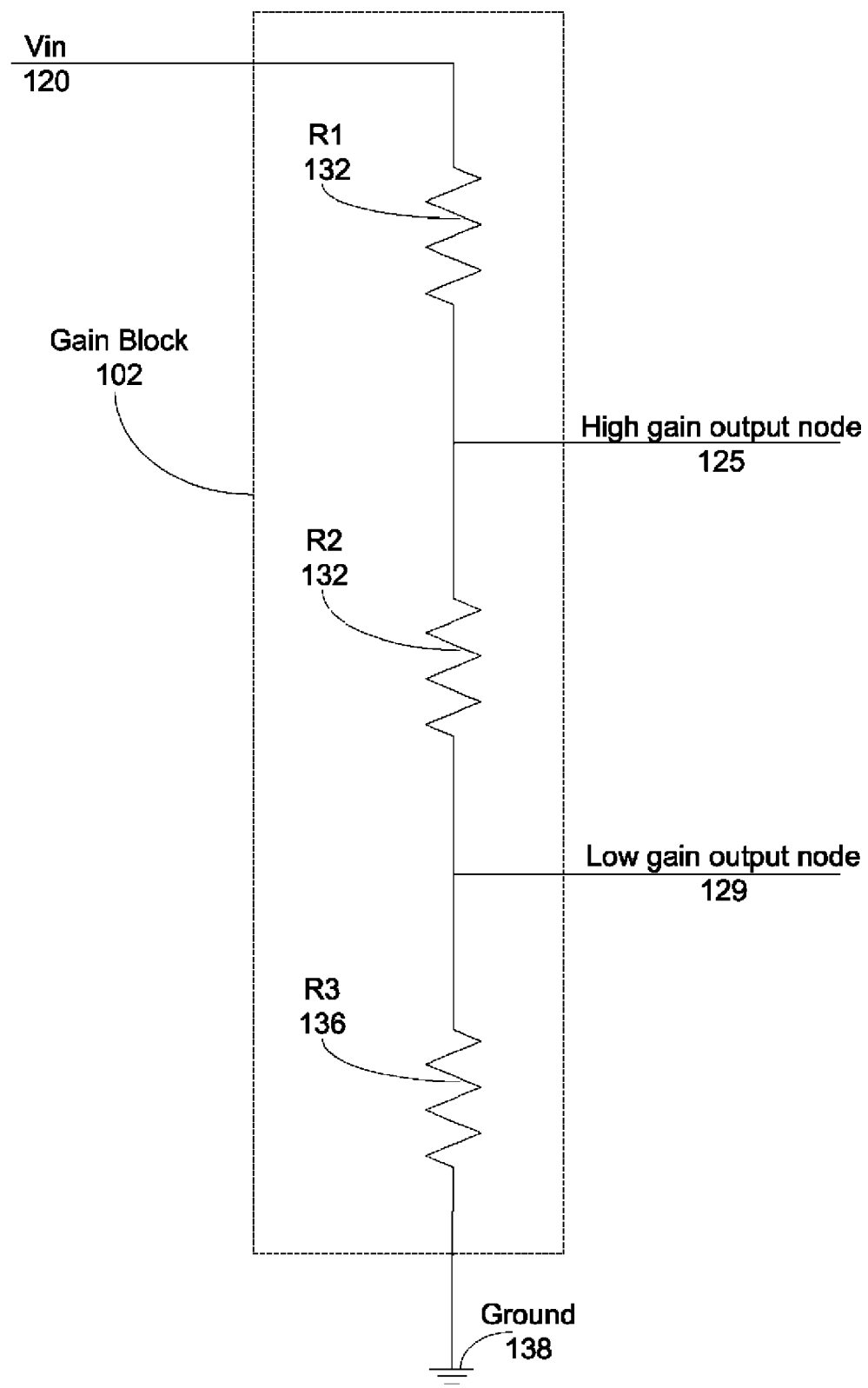
FIG. 1B is a block diagram of a gain block according to an example embodiment.

FIG. 1B is a block diagram of the gain block 102 according to an example embodiment. The gain block 102 may include, for example, an attenuator. The gain block 102 or attenuator may include at least one resistive element, such as a first resistor 132, coupled between the input signal 120 and a high gain output node 125. The high gain output node 125 may be coupled to the high gain output tap 124 shown in FIG. 1A. The gain block 102 or attenuator may also include at least one resistive element, such as a second resistor 134, coupled between the high gain output node 125 and a low gain output node 129. The low gain output node 129 may be coupled to the low gain output tap 126 shown in FIG. 1A. The gain block 102 or attenuator 102 may also include at least one resistive element, such as a third resistor 136, coupled between the low gain output node 129 and ground 138.

Figure 2:
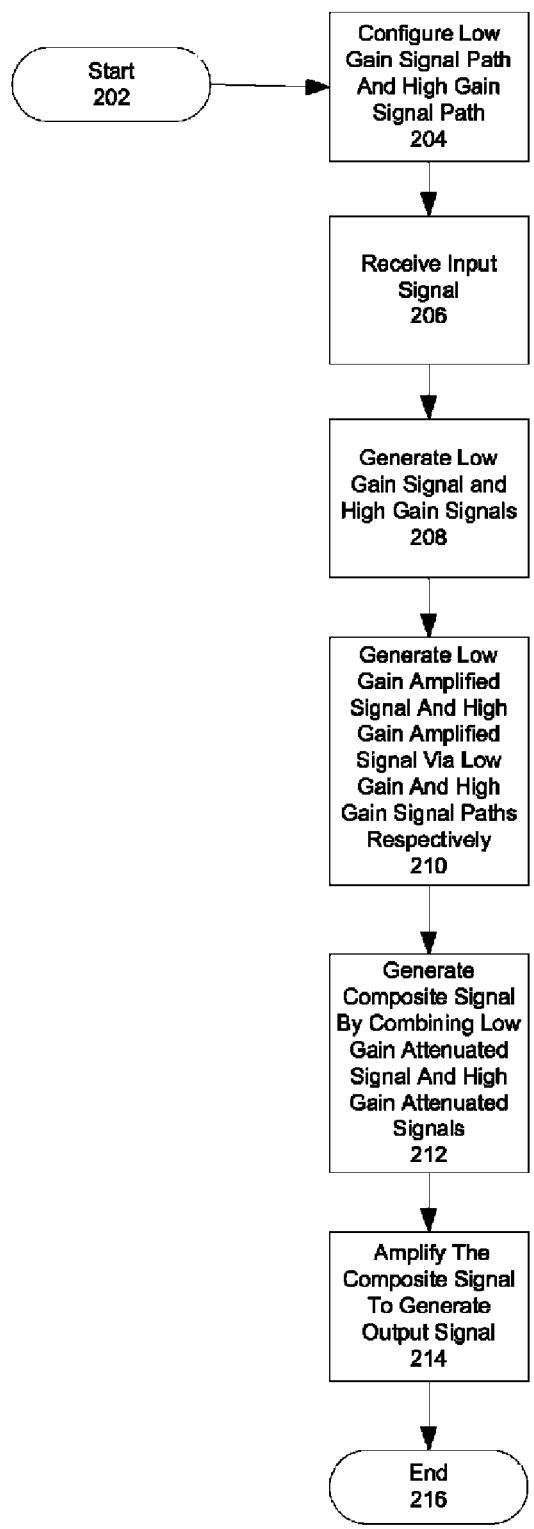
FIG. 2 is a flowchart illustrating example operations of the VGA topology of FIG. 1 according to an example embodiment.

FIG. 2 is a flowchart illustrating example operations of the VGA topology of FIG. 1 according to an example embodiment. The process is initiated (202). A low gain signal path and a high gain signal path may be configured (204). As described with respect to FIG. 1, the low gain signal path and high gain signal path may each respectively comprise a separate gain stage further, each gain stage further comprising a plurality of amplification elements. Each of the amplification elements may be selectively activated or deactivated via the digital control block 127. An input signal that is to be amplified may be received (206). A low gain attenuated signal and a high gain attenuated signal may be respectively generated (208). The generation of the low and high gain attenuated signals may be achieved via the gain block 102. A low gain amplified signal and a high gain amplified signal may be respectively generated from the low gain attenuated signal and the high gain attenuated signal via the low gain signal path and the high gain signal path (210). A composite signal may be generated by combining the low gain amplified signal and the high gain amplified signal (212). This combination may be achieved, for example, by summing the low gain amplified signal and the high gain amplified signal at a common node. The composite signal may then be further amplified to generate a VGA output signal (214). This further amplification may be achieved in a cascaded fashion. VGA amplification may now be completed (216).

Figure 3A:
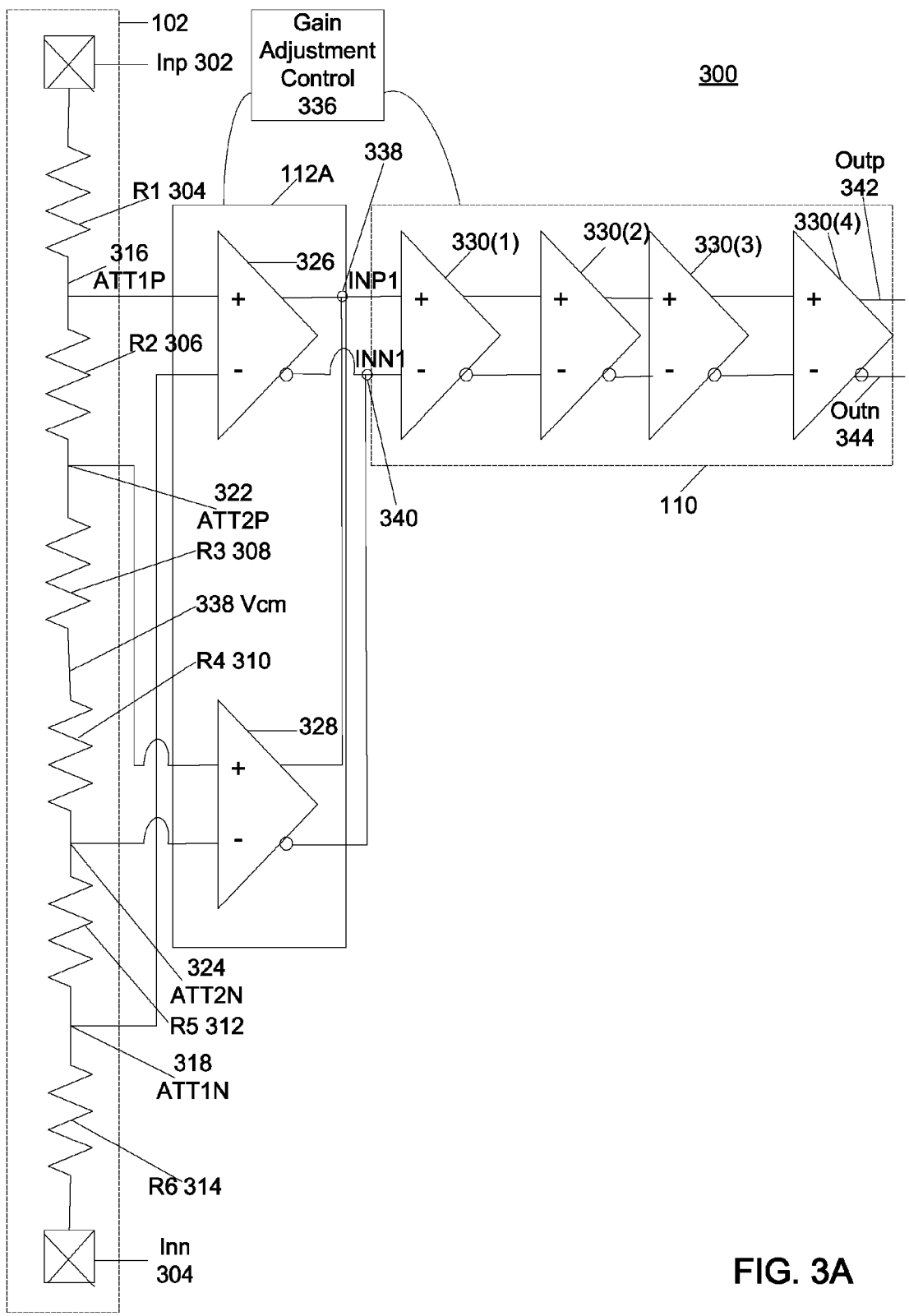
FIG. 3A is a schematic diagram of a VGA amplifier with high bandwidth and high linearity that incorporates differential signaling according to an example embodiment.

FIG. 3A is a schematic of a VGA amplifier 300 with high bandwidth and high linearity that incorporates differential signaling according to an example embodiment. FIG. 3A provides a specific example of the topology shown in FIG. 1. The VGA may include a gain block 102, a parallel gain block 112A and a cascade gain block 110. A differential signal (not shown in FIG. 3A) may be received via differential inputs Inp 302 and Inn 304 at gain block 102. The gain block 102 may be an attenuator that comprises a resistive ladder having a plurality of resistors (e.g., R1 304, R2 306, R3 308, R4 310, R5 312 and R6 314).

The gain block 102 may provide various output taps for generating differential output signals having various levels of attenuation. For example, the gain block 102 may generate high gain differential signals (ATT1P 316, ATT 1N 318) and low gain differential signals (ATT2P 322, ATT2N 324). Thus, the gain block 102 may include output tap 316 generating signal ATT1P, output tap 318 generating signal ATT1N, output tap 322 generating signal ATT2P, and output tap 324 generating signal ATT2N. In the case where the gain block 102 is an attenuator using passive components, the various amplitude output signals from the gain block 102 may be generated via the technique of a voltage divider using a resistive ladder as shown in FIG. 3A. The ATT 1N and ATT2N signals shown in FIG. 3A may correspond to the following amplitudes:

$$ATT1P = \frac{R2 + R3}{R1 + R2 + R3}(Inp - Vcm)$$

$$ATT2P = \frac{R3}{R1 + R2 + R3}(Inp - Vcm)$$

Similarly the ATT2N and ATT2P signals shown in FIG. 3A may correspond to the following amplitudes:

$$ATT1N = \frac{R4 + R5}{R4 + R5 + R6}(Inn - Vcm)$$

$$ATT2N = \frac{R4}{R4 + R5 + R6}(Inn - Vcm)$$

High gain differential signal (ATT1P, ATT1N) and low gain differential signal (ATT2P, ATT2N) may be respectively provided to parallel block 112A. In particular, as shown in FIG. 3A, the high gain differential signal (ATT1P, ATT1N) may be provided to a first differential parallel gain stage 326 while low gain differential signal (ATT2P, ATT2N) may be provided to a second differential parallel gain stage 328. Each of the differential parallel gain stages (326, 328) may provide amplification of their respective input signals. According to one embodiment, parallel gain stages 326 and 328 may be identical providing identical amplitude gain and phase delay. It is also possible to achieve a unity gain by omitting resistor R1.

The differential outputs of the parallel gain block 112A may be provided to a cascade gain stage 110 where they are summed at respective common differential node inputs (338, 340). The differential signal provided to cascade gain block 110 may then be amplified by any number of cascaded gain stages (e.g., 330(1), 330(2), 330(3), 330(4)) to generate differential outputs 342 and 344. Although FIG. 3A shows only four cascaded gain stages, it will be understood that cascade gain stage 110 may include any arbitrary number of cascaded gain stages. A gain adjustment control 336 may adjust a gain of the gain block 112A and/or the cascade gain stage 110.

Figure 3B:
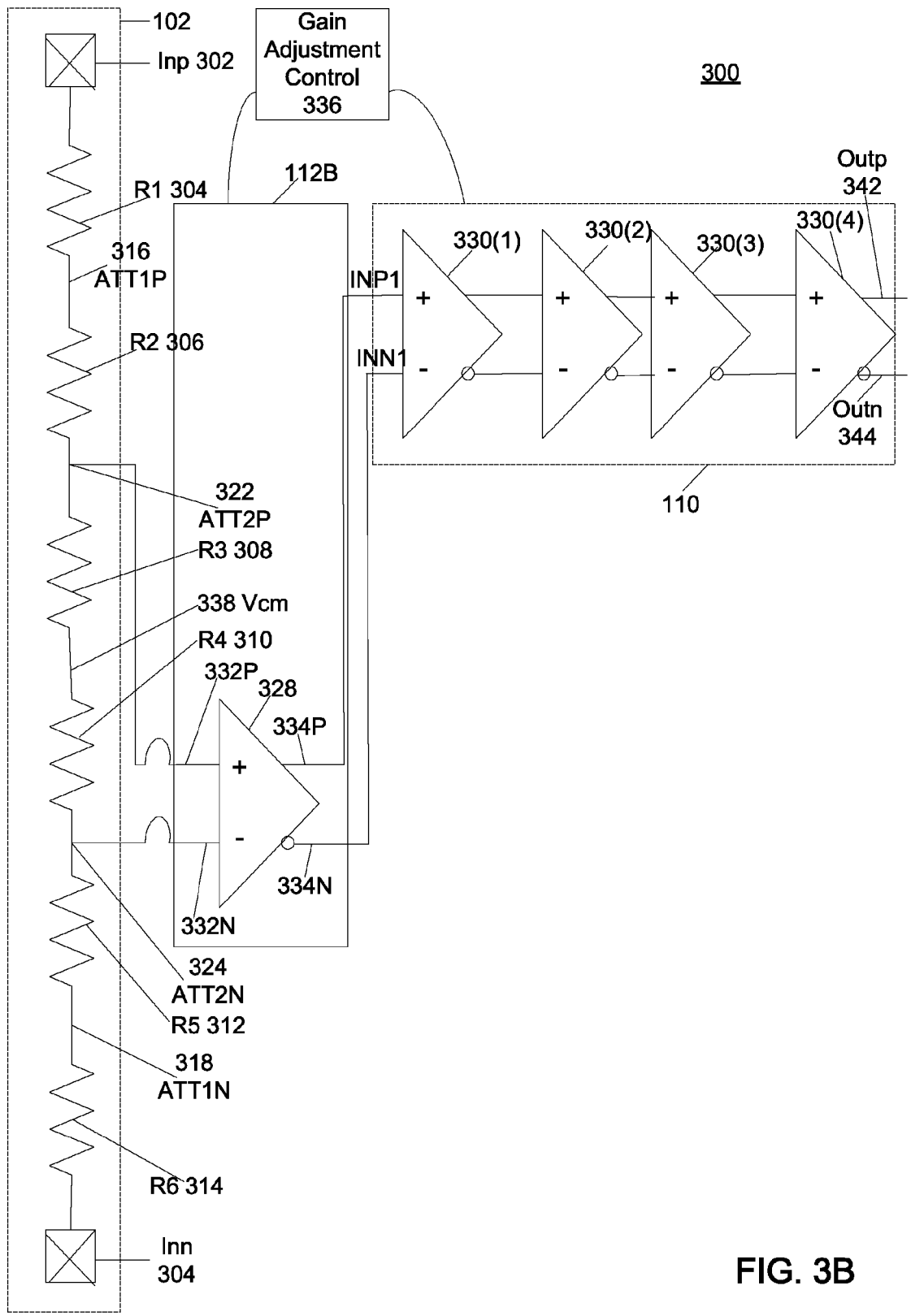
FIG. 3B is a schematic diagram of a VGA amplifier with high bandwidth and high linearity that incorporates differential signaling according to another example embodiment.

FIG. 3B is a schematic of the VGA amplifier 300 with high bandwidth and high linearity that incorporates differential signaling according to another example embodiment. In this example, the VGA 300 may include the gain block 102, which may include an attenuator as described with reference to FIG. 3A, and the cascade gain block 110 as described with reference to FIG. 3A. In the example shown in FIG. 3B, the VGA 300 may include a gain block 112B. In this example, the gain block 112B may include at least one pair of gain block differential input nodes 332P, 332N. The gain block differential input nodes 332P, 332N may, for example, include input nodes of the gain stage 328. The gain block 112B may, for example, include only a single gain stage 328. The gain block differential input nodes 332P, 332N may be coupled to attenuator differential output nodes, such as the output tap 322 and output tap 324.

The gain block 112B may also include at least one pair of gain block differential output nodes 334P, 334N. The gain block differential output nodes 334P, 334N may, for example, include output nodes of the gain stage 328. The gain block differential output nodes 334P, 334N may be coupled to the cascaded gain block 110, according to an example embodiment.

In the example shown in FIG. 3B, the VGA 300 may also include a gain adjustment control 336. The gain adjustment control 336 may be configured to adjust a gain of the gain stage 328 included in the gain block 112B and/or the cascaded gain block 110. The gain adjustment control 336 may, for example, include a digital control, such as the digital control block 127 described with reference to FIG. 1. In an example embodiment, the gain adjustment control 336 may adjust the gain of the gain block 112B by receiving a desired overall gain parameter as an input, and providing a digital control signal to the gain block 112B as output. The gain adjustment control 336 may, for example, provide the digital control signal to the gain stage 328. The gain adjustment control 336 may, for example, amplify the differential signal received by the gain block 112B to a desired level, such as to create a constant amplitude signal.

In an example embodiment, the VGA 300 may receive a differential signal via the differential inputs Inp 302 and Inn 304. The amplitude of the differential signal may be unknown. In an example embodiment, the gain block 102, which may include an attenuator such as a resistive ladder, may reduce the amplitude of the differential signal. The gain block 102 may also reduce input referred effective capacitance of the gain stage 328. This reduction in input referred effective capacitance may, for example, provide superior return loss performance of the signal outputted via the differential node inputs 338, 340 and/or the differential outputs 342, 344. The gain block 112B may amplify the differential signal, the amplitude of which may have been unknown, to a desired amplitude.

In an example embodiment, the gain block 102 or attenuator may include a plurality of resistive elements, such as resistors or transistors (such as metal-oxide semiconductor transistors). In the example shown in FIG. 3B, the resistive elements include resistors 304, 306, 308, 310, 312, 314. The gain block 102 or attenuator may, for example, include at least one resistive element, such as resistors 304, 306, coupled between the positive input node 302 and the positive output node or output tap 322. The gain block 102 or attenuator may also include at least one resistive element, such as resistors 312, 314, coupled between the negative input node 304 and negative output node or output tap 324. The gain block 102 or attenuator may also include at least one resistive element, such as the resistors 308, 310, coupled between the differential output nodes or outputs taps 322, 324, according to an example embodiment.

For example, Inp 302 and Inn 304 may be considered a junction point where return losses occur. Incoming signal Vin 120 may be received from a transmission line such as a printed circuit board trace or cable. The impedance of this transmission line may be considered, "source impedance," and denoted as $Z_O$. The differential load impedance seen at Inp 302 and Inn 304 may be considered, "load impedance," and denoted as $Z_L$.

Return loss, denoted as $R_L$ (in decibels) may be calculated as follows:

$$R_L (\text{in dB}) = 20 \log \left| \frac{Z_L - Z_o}{Z_L + Z_o} \right|$$

Gain stage 328 may load the nodes 322 and 324. Considering this loading as purely capacitive, this load may be denoted as $C_L$ differential capacitance between nodes 322 and 324. Load impedance and the return loss, when the attenuation network is employed, may be calculated as follows:

$$Z_L = R_1 + R_2 + R_5 + R_6 + \frac{R_3 + R_4}{1 + sC_L(R_3 + R_4)}$$

(With attenuation network 102)

$$R_L = 20 \log \left| \frac{\left(R_1 + R_2 + R_5 + R_6 + \frac{R_3 + R_4}{1 + sC_L(R_3 + R_4)}\right) - Z_o}{\left(R_1 + R_2 + R_5 + R_6 + \frac{R_3 + R_4}{1 + sC_L(R_3 + R_4)}\right) + Z_o} \right|$$

(With attenuation network 102)

If the gain block 102 or attenuation network is not employed, gain stage 328 may be connected to 302 and 304, and $C_L$ differential capacitance may be between 322 and 324. Load impedance and the return loss, when the attenuation network is not employed, may be calculated as follows:

$$Z_L = \frac{R_1 + R_2 + R_3 + R_4 + R_5 + R_6}{1 + sC_L(R_1 + R_2 + R_3 + R_4 + R_5 + R_6)}$$

(Without attenuation network 102)

$$R_L = 20 \log \left| \frac{\left(\frac{R_1 + R_2 + R_3 + R_4 + R_5 + R_6}{1 + sC_L(R_1 + R_2 + R_3 + R_4 + R_5 + R_6)}\right) - Z_o}{\left(\frac{R_1 + R_2 + R_3 + R_4 + R_5 + R_6}{1 + sC_L(R_1 + R_2 + R_3 + R_4 + R_5 + R_6)}\right) + Z_o} \right|$$

(With attenuation network 102)

As these return loss equations show, the attenuation network may reduce the effect of $C_L$ differential capacitance on return loss. The attenuation network may cause the return loss to become lower or better, according to an example embodiment.

Figure 4:
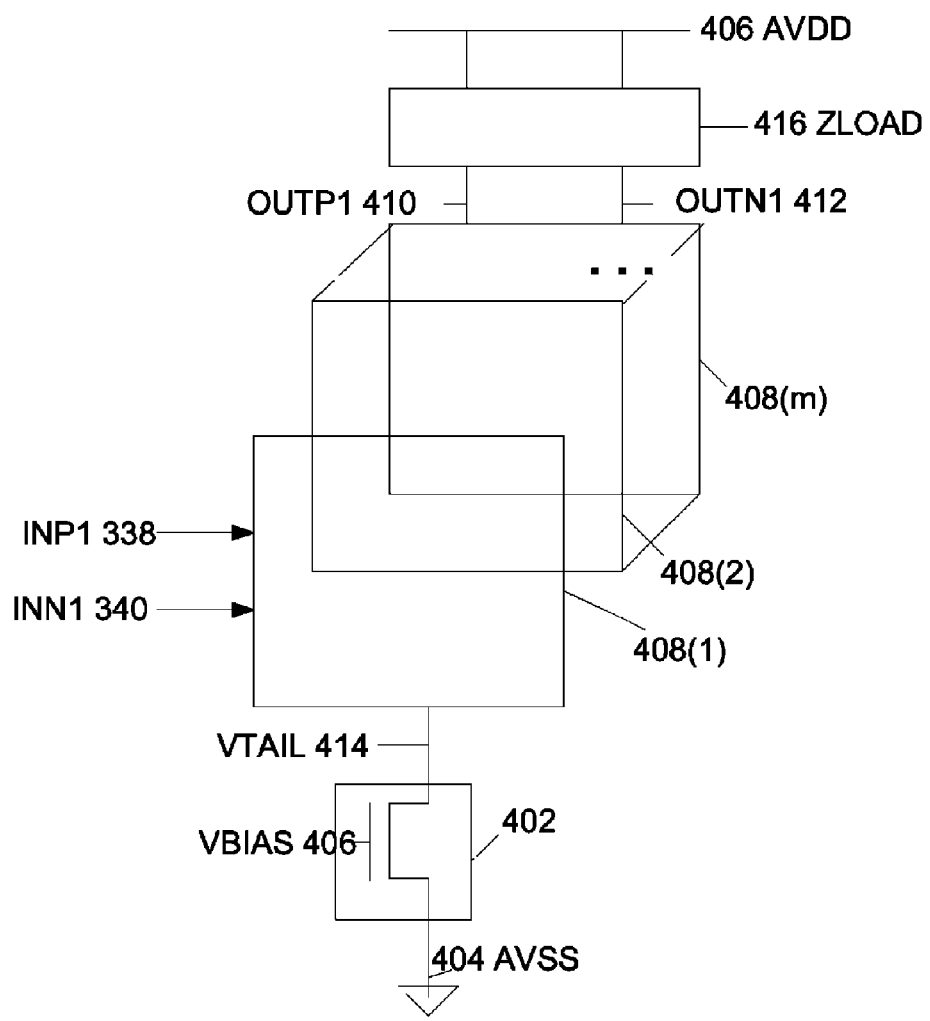
FIG. 4 is a schematic diagram of a cascaded gain stage according to an example embodiment.

FIG. 4 is a schematic diagram of a cascaded gain stage 110 according to an example embodiment. Any number of cascaded gain stages 330 may be included in a cascade gain block 110. Each cascaded gain stage 330 may include any number of gm elements 408(1)-408(m) (described below with reference to FIG. 6), which in aggregate operation achieve a gain for the cascaded gain stage 330. In particular, each gm element 408(1)-408(m) may be selectively activated or deactivated to adjust an overall gain for the cascaded gain stage 330. Each of the gm elements may be viewed as a separate amplification element for the stage. Each of the gm elements 408(1)-408(m) may be a differential pair arranged in a common source configuration as described below with reference to FIG. 6.

The gm elements 408(1)-408(m) may all respectively be coupled at their source nodes to a tail transistor 402 that may operate as a current source. Further, the gm elements 408(1)-408(m) may all respectively be coupled to a load block ZLOAD 416, which may comprise either a passive load such as a resistor or an active load possibly generated using one or more MOSFET transistors.

A voltage source AVDD 406 may be coupled to the load block ZLOAD 416, to provide a voltage bias. The source of the tail transistor 404 may be coupled to a common voltage reference AVSS 404. Differential input signal INP1 338 and INN1 340 may be provided as input to each of the gm elements 408(1)-408(m). The input differential signal INP1 338 and INN1 340 may be amplified by each of the gm elements 408(1)-408(m) to generate a composite amplified differential signal OUTP1 410 and OUTN1 412.

Figure 5:
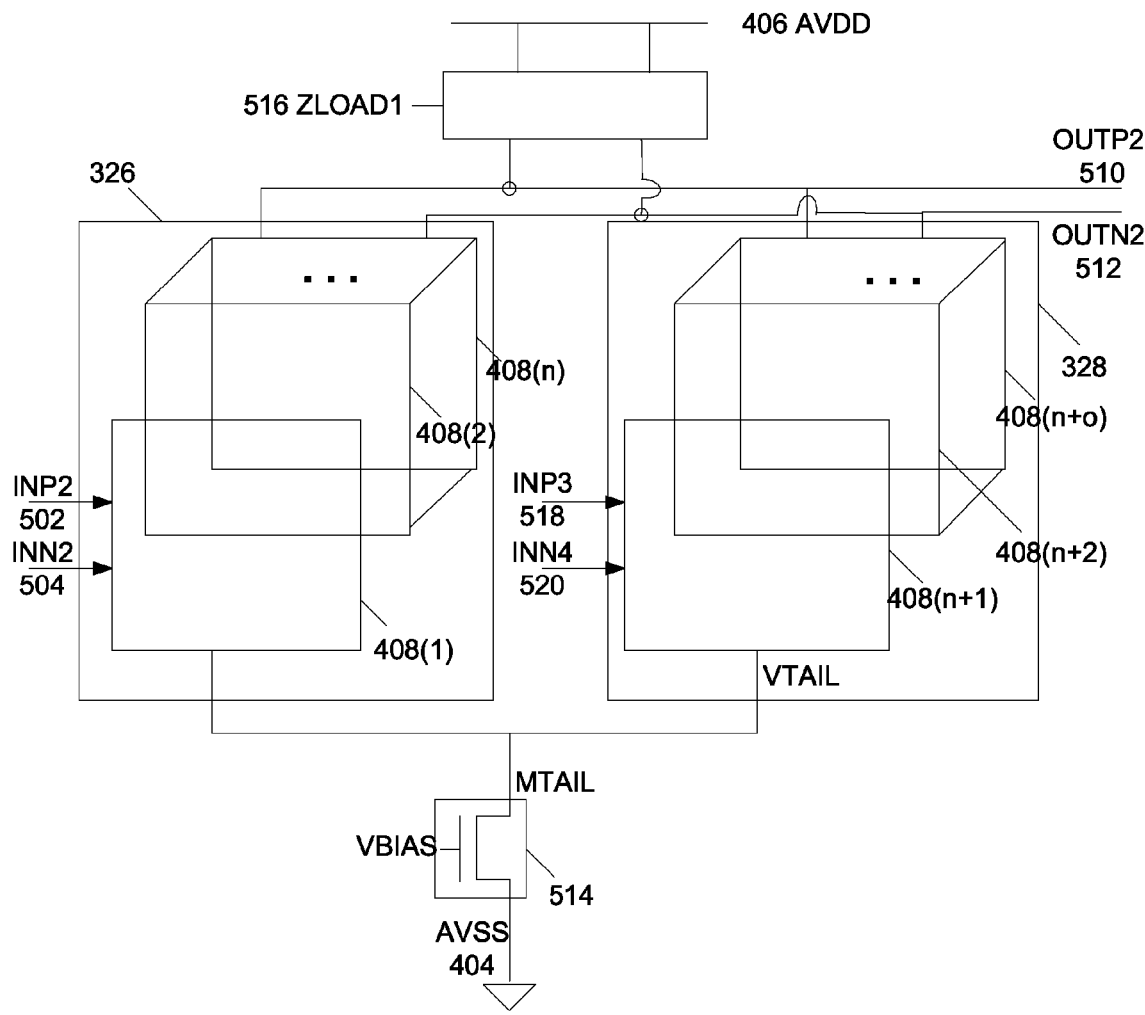
FIG. 5 is a schematic diagram of a parallel gain block according to an example embodiment.

FIG. 5 is a schematic diagram of a parallel gain block 112A according to an example embodiment. The parallel gain block 112A may include a first differential parallel gain stage 326 and a second differential parallel gain stage 328. Each parallel gain stage 326, 328 may include any number of gm elements (respectively 408(1)-408(n) and 408(n+1)-408(n+o)) (described below with reference to FIG. 6), which in aggregate operation achieve a gain for each of the parallel gain stages 326 and 328 in the parallel gain block 112A. In particular, each gm element 408(1)-408(n) and 408(n+1)-408(n+o) may be selectively activated or deactivated to adjust an overall gain for their respective gain stages 326, 328. Each of the gm elements 408(1)-408(n) and 408(n+1)-408(n+o) may be a differential pair arranged in a common source configuration as described below with reference to FIG. 6.

The gm elements 408(1)-408(n), 408(n+1)-408(n+o) may all respectively be coupled to a tail transistor 514 that may operate as a current source. Further, the gm elements 408(1)-408(n), 408(n+1)-408(n+o) may all respectively be coupled to a load block ZLOAD 516, which may comprise either a passive load such as a resistor or an active load possibly generated using one or more MOSFET transistors.

A voltage source AVDD 406 may be coupled to the load block ZLOAD 516, to provide a voltage bias. The source of the tail transistor 514 may be coupled to a common voltage reference AVSS 404. Differential input signal INP2 502, INN2 504 may be provided as input to the first parallel gain stage 326, while differential input signal INP3 518, INN3 520 may be provided as an input to the second differential parallel gain stage 328. Each of the differential signals (INP2 502, INN2 504 and INP3 518, INN3 520) may be amplified by the respective parallel gain stages 326, 328 to generate respective outputs (not shown in FIG. 5), which are combined at a common node to produce a differential output signal OUTP2 510, OUTN2 512.

Figure 6:
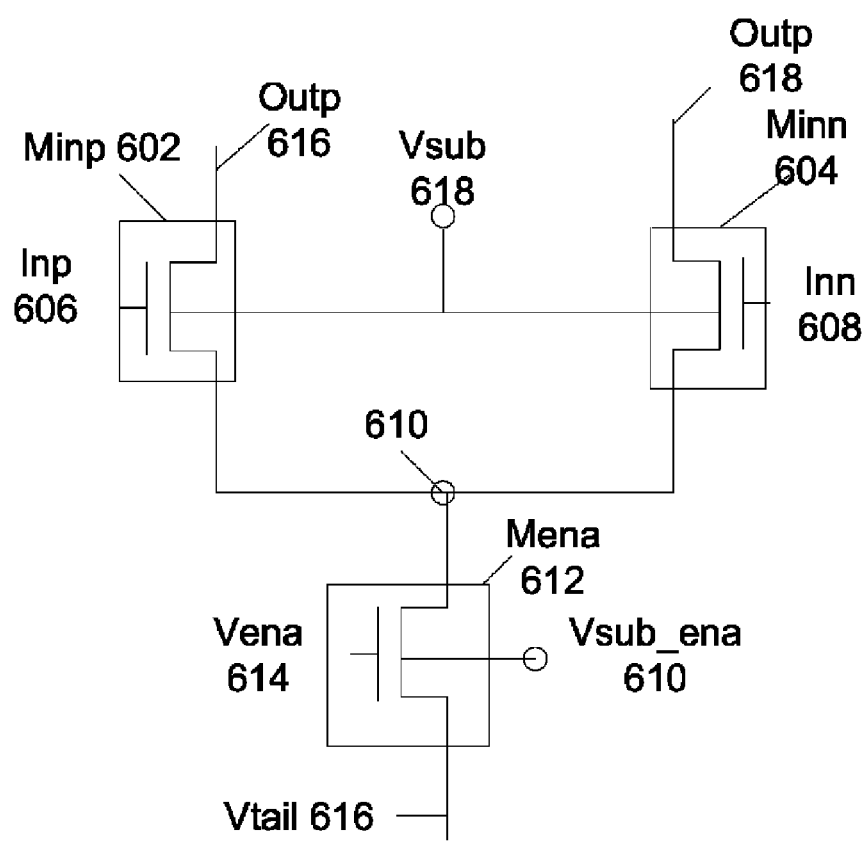
FIG. 6 is a schematic diagram of a differential pair that may be utilized as a gm element in a parallel gain stage or a cascade gain stage according to an example embodiment.

FIG. 6 is a schematic diagram of a differential pair that may be utilized as a gm element in a parallel gain stage or a cascade gain stage according to an example embodiment. The differential pair 600 may include a first input transistor 602 and a second input transistor 604 respectively receiving input signals Inp 606 and Inn 608. Although the differential pair 600 shown in FIG. 6 utilizes nmos transistors for input transistors 602, 604, the input transistors 602, 604 may also be pmos transistors. The substrate of each of the input transistors 602, 604 may be coupled to a common substrate node Vsub 606.

Figure 7:
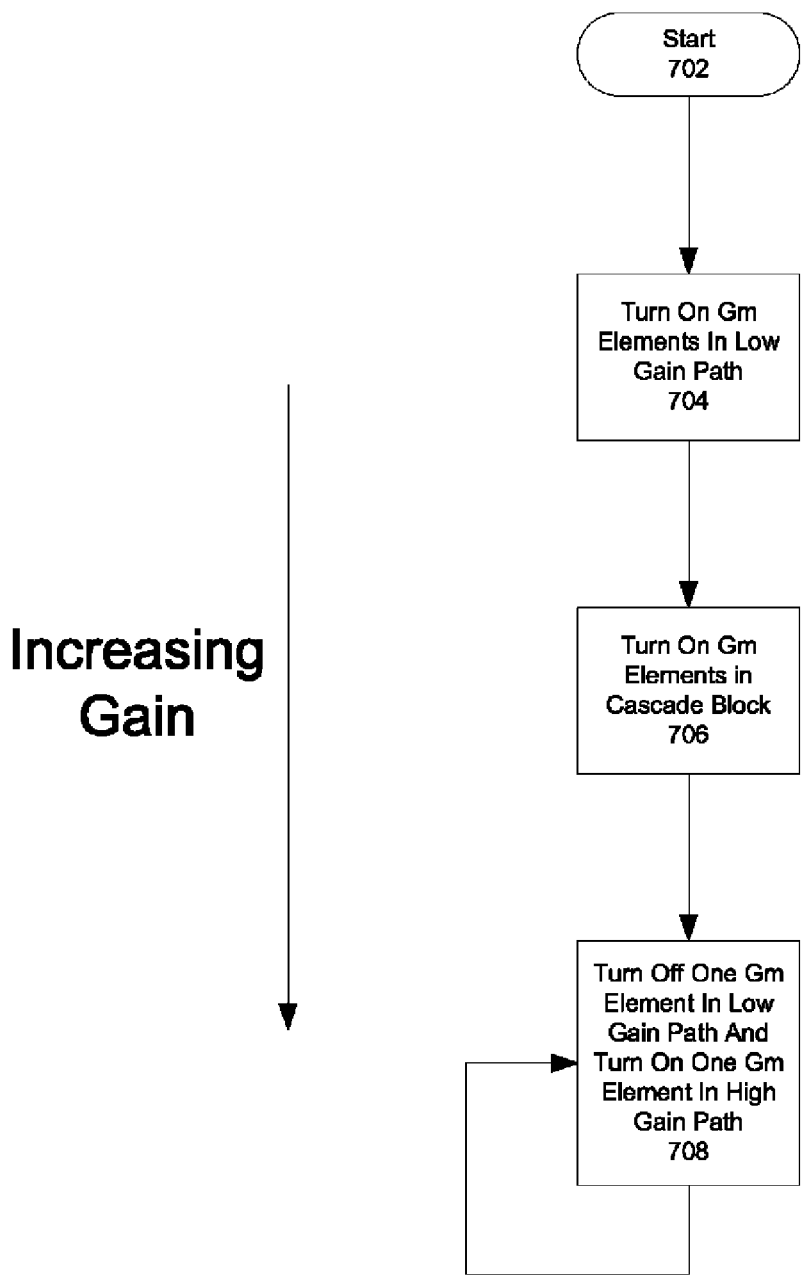
FIG. 7 is a flowchart of a process for selecting a gain for a VGA according to an example embodiment.

FIG. 7 is a flowchart that illustrates a process for increasing or decreasing the gain achieved with a VGA according to an example embodiment. The process is initiated in step 702. In step 704, a set of gm elements in the low gain path 122 may be activated. In step 706, the gain may be increased by turning on a set of gm elements in the cascade block 110. In step 708, the gain may be further increased by turning on gm elements in the high gain path 121 while correspondingly turning off the same number of gm elements in the low gain path 122. By turning on and off corresponding numbers of gm elements in the low gain 122 and high gain paths 121 ensures maintenance of a fixed common mode. Of course the overall gain for the VGA may be lowered by following the process as shown in FIG. 7 in reverse order.

The source nodes of each of the input transistors 602, 604 may both be coupled together at a common node 610, which is also coupled to a third transistor Mena 612. The third transistor Mena 612 may itself be coupled to a current source, for example a common current source transistor such as Mtail 514 shown in FIG. 5. The differential pair 600 may be selectively activated or deactivated by respectively turning transistor Mena 612 on or off. Gain may be achieved for the differential pair 600 by steering current from the source/drain of transistor Inp 606 and the source/drain of transistor Inn 608. The third transistor Mena 612 may receive bias signal Vena 614, with its substrate note biased by a signal Vsub_ena 610.

Figure 8:
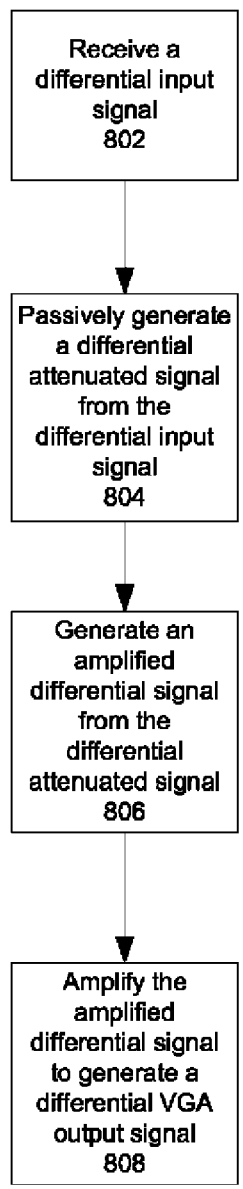
FIG. 8 is a flowchart showing a method according to an example embodiment.

FIG. 8 is a flowchart showing a method according to an example embodiment. In this example, the method may include receiving a differential input signal (802). The differential input signal may be received, for example, via the differential inputs Inp 302, Inn 304. The method may also include passively generating a differential attenuated signal from the differential input signal (804). The differential attenuated signal may, for example, be passively generated by the gain block 102, which may include an attenuator such as a resistive ladder. The method may also include generating an amplified differential signal from the differential attenuated signal (806). The amplified differential signal may, for example, be generated by the gain block 112B. The method may also include amplifying the amplified differential signal to generate a differential VGA output signal (808). The amplified differential signal may, for example, be amplified by the cascade gain block 110.

In an example embodiment, passively generating the differential attenuated signal may include providing the differential input signal to at least two inputs Inp 302, Inn 304 of a resistive ladder and respectively tapping the resistive ladder at a first output node 322 and a second output node 324, the first output node 322 and the second output node 324 providing the differential attenuated signal.

In an example embodiment, amplifying the amplified differential signal may comprise amplifying the amplified differential signal in a cascade manner.

In an example embodiment, amplifying the amplified differential signal may comprise amplifying the amplified differential signal in a cascade manner using a plurality of amplifier stages.

In an example embodiment, generating the amplified differential attenuated signal may include generating the amplified differential signal from the differential attenuated signal based at least in part on a digital control signal. The digital control signal may, for example, be provided by a gain adjustment control 336 such as a digital control block 127.

The various techniques described herein may be implemented in digital electronic circuitry, or in computer hardware, firmware, software, or in combinations of them. Furthermore, these techniques may also be implemented as a computer program product, i.e., a computer program tangibly embodied in an information carrier, e.g., in a machine-readable storage device or in a propagated signal, for execution by, or to control the operation of, data processing apparatus, e.g., a programmable processor, a computer, or multiple computers. A computer program, such as the computer program(s) described above, can be written in any form of programming language, including compiled or interpreted languages, and can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a communication network.

Method steps may be performed by one or more programmable processors executing a computer program to perform functions by operating on input data and generating output. Method steps also may be performed by, and an apparatus may be implemented as, special purpose logic circuitry, e.g., an FPGA (field programmable gate array) or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. Elements of a computer may include at least one processor for executing instructions and one or more memory devices for storing instructions and data. Generally, a computer also may include, or be operatively coupled to receive data from or transfer data to, or both, one or more mass storage devices for storing data, e.g., magnetic, magneto-optical disks, or optical disks. Information carriers suitable for embodying computer program instructions and data include all forms of non-volatile memory, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory may be supplemented by, or incorporated in special purpose logic circuitry.

To provide for interaction with a user, implementations may be implemented on a computer having a display device, e.g., a cathode ray tube (CRT) or liquid crystal display (LCD) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input.

Implementations may be implemented in a computing system that includes a back-end component, e.g., as a data server, or that includes a middleware component, e.g., an application server, or that includes a front-end component, e.g., a client computer having a graphical user interface or a Web browser through which a user can interact with an implementation, or any combination of such back-end, middleware, or front-end components. Components may be interconnected by any form or medium of digital data communication, e.g., a communication network. Examples of communication networks include a local area network (LAN) and a wide area network (WAN), e.g., the Internet.

While certain features of the described implementations have been illustrated as described herein, many modifications, substitutions, changes and equivalents will now occur to those skilled in the art. It is, therefore, to be understood that the appended claims are intended to cover all such modifications and changes as fall within the true spirit of the various embodiments.

What is claimed is:

1. A high bandwidth, fine granularity variable gain amplifier ("VGA") comprising:
   an attenuator, the attenuator comprising at least one pair of attenuator differential input nodes and at least one pair of attenuator differential output nodes;
   a gain block, the gain block comprising at least one pair of gain block differential input nodes coupled to the at least one pair of attenuator differential output nodes and at least one pair of gain block differential output nodes; and
   a gain adjustment control configured to adjust a gain of the gain block,
   wherein the attenuator comprises:
   the at least one pair of attenuator differential input nodes including a positive attenuator input node and a negative attenuator input node;
   the at least one pair of attenuator differential output nodes including a positive attenuator output node and a negative attenuator output node;
   at least a first resistive element coupled between the positive attenuator input node and the positive attenuator output node; and
   at least a second resistive element coupled between the negative attenuator input node and the negative attenuator output node.

2. The VGA of claim 1, further comprising a cascade gain block coupled to the at least one pair of gain block differential output nodes.

3. The VGA of claim 1, further comprising a cascade gain block coupled to the at least one pair of gain block differential output nodes, the cascade gain block including a plurality of amplifier stages arranged in a cascade configuration.

4. The VGA of claim 1, wherein the attenuator comprises a passive network.

5. The VGA of claim 1, wherein the attenuator comprises a resistive ladder.

6. The VGA of claim 1, wherein the attenuator comprises at least one resistive element coupled between the at least one pair of attenuator differential output nodes.

7. The VGA of claim 1, wherein the gain adjustment control is configured to adjust the gain of the gain block by receiving a desired overall gain parameter as an input and providing a digital control signal to the gain block as output.

8. A high bandwidth, fine granularity variable gain amplifier ("VGA") comprising:
   an attenuator, the attenuator comprising at least one input node, a high gain output node, and a low gain output node;

a gain block, the gain block comprising:
  at least one pair of gain block differential input nodes coupled to the high gain output node and the low gain output node; and
  at least one pair of gain block differential output nodes; and
a gain adjustment control configured to adjust a gain of the gain block,
wherein the attenuator comprises:
the at least one input node;
the high gain output node;
the low gain output node;
at least a first resistive element coupled between the at least one input node and the high gain output node;
at least a second resistive element coupled between the low gain output node and a ground; and
at least a third resistive element coupled between the high gain output node and the low gain output node.

9. A high bandwidth, fine granularity variable gain amplifier ("VGA") comprising:
  an attenuator, the attenuator comprising at least one pair of attenuator differential input nodes and at least one pair of attenuator differential output nodes;
  a gain block, the gain block comprising at least one pair of gain block differential input nodes coupled to the at least one pair of attenuator differential output nodes and at least one pair of gain block differential output nodes; and
  a gain adjustment control configured to adjust a gain of the gain block,
wherein the attenuator comprises:
the at least one pair of attenuator differential input nodes including a positive attenuator input node and a negative attenuator input node;
the at least one pair of attenuator differential output nodes including a positive attenuator output node and a negative attenuator output node;
at least a first resistive element coupled between the positive attenuator input node and the positive attenuator output node;
at least a second resistive element coupled between the negative attenuator input node and the negative attenuator output node; and
at least a third resistive element coupled between the at least one pair of attenuator differential output nodes.

10. A high bandwidth, fine granularity variable gain amplifier ("VGA") comprising:
  an attenuator, the attenuator comprising at least one pair of attenuator differential input nodes and at least one pair of attenuator differential output nodes;
  a gain block, the gain block comprising at least one pair of gain block differential input nodes coupled to the at least one pair of attenuator differential output nodes and at least one pair of gain block differential output nodes; and
  a gain adjustment control configured to adjust a gain of the gain block,
wherein the attenuator comprises:
the at least one pair of attenuator differential input nodes including a positive attenuator input node and a negative attenuator input node;
the at least one pair of attenuator differential output nodes including a positive attenuator output node and a negative attenuator output node;
at least a first resistor coupled between the positive attenuator input node and the positive attenuator output node;
at least a second resistor coupled between the negative attenuator input node and the negative attenuator output node; and
at least a third resistor coupled between the at least one pair of attenuator differential output nodes.

* * * * *

UNITED STATES PATENT AND TRADEMARK OFFICE
CERTIFICATE OF CORRECTION

| | | |
|---|---|---|
| PATENT NO. | : 7,755,426 B2 | Page 1 of 1 |
| APPLICATION NO. | : 12/135720 | |
| DATED | : July 13, 2010 | |
| INVENTOR(S) | : Namik K. Kocaman et al. | |

It is certified that error appears in the above-identified patent and that said Letters Patent is hereby corrected as shown below:

On the Title page, in Item (63), in column 1, under "Related U.S. Application Data", line 1, delete "Continuation" and insert -- Continuation-in-part --, therefor.

Signed and Sealed this

Thirtieth Day of November, 2010

David J. Kappos
*Director of the United States Patent and Trademark Office*